US010698006B2

(12) United States Patent
Nakamura et al.

(10) Patent No.: US 10,698,006 B2
(45) Date of Patent: Jun. 30, 2020

(54) INSPECTION METHOD AND INSPECTION APPARATUS

(71) Applicant: HAMAMATSU PHOTONICS K.K., Hamamatsu-shi, Shizuoka (JP)

(72) Inventors: Tomonori Nakamura, Hamamatsu (JP); Akihiro Otaka, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 239 days.

(21) Appl. No.: 15/548,860

(22) PCT Filed: Feb. 2, 2016

(86) PCT No.: PCT/JP2016/053088
§ 371 (c)(1),
(2) Date: Aug. 4, 2017

(87) PCT Pub. No.: WO2016/129458
PCT Pub. Date: Aug. 18, 2016

(65) Prior Publication Data
US 2018/0031614 A1 Feb. 1, 2018

(30) Foreign Application Priority Data

Feb. 10, 2015 (JP) ................................ 2015-024585

(51) Int. Cl.
*G01R 15/24* (2006.01)
*G01R 31/265* (2006.01)
(Continued)

(52) U.S. Cl.
CPC ....... *G01R 15/245* (2013.01); *G01R 31/2656* (2013.01); *G01R 31/311* (2013.01); *G02B 27/62* (2013.01)

(58) Field of Classification Search
CPC .............. G01R 15/245; G01R 31/2656; G01R 31/311; G02B 27/62
(Continued)

(56) References Cited

U.S. PATENT DOCUMENTS 6,141,093 A   10/2000 Argyle et al.
7,271,900 B2 * 9/2007 Decitre .............. G01R 33/0322
356/237.2
(Continued)

FOREIGN PATENT DOCUMENTS

CN    1947000 A    4/2007
CN  101650953 A    2/2010
(Continued)

OTHER PUBLICATIONS

Minhhuy Le et al., "A simulation of magneto-optical eddy current imaging", NDT&E International, vol. 44, 2011, p. 783-p. 788.
(Continued)

*Primary Examiner* — Melissa J Koval
*Assistant Examiner* — Rahul Maini
(74) *Attorney, Agent, or Firm* — Faegre Drinker Biddle & Reath LLP

(57) ABSTRACT

An inspection apparatus includes a tester unit that applies a stimulus signal to a semiconductor apparatus, an MO crystal arranged to face a semiconductor apparatus, a light source that outputs light, an optical scanner that irradiates the MO crystal with light output from light source, a light detector that detects light reflected from the MO crystal arranged to face the semiconductor apparatus D and outputs a detection signal, and a computer that generate phase image data based on a phase difference between a reference signal generated based on a stimulus signal and the detection signal, the phase image data including a phase component indicating the phase difference, and generates an image indicating a path of a current from the phase image data.

14 Claims, 13 Drawing Sheets

(51) Int. Cl.
*G01R 31/311* (2006.01)
*G02B 27/62* (2006.01)

(58) Field of Classification Search
USPC .................................................. 324/754.23
See application file for complete search history.

(56) References Cited

U.S. PATENT DOCUMENTS

| | | | |
|---|---|---|---|
| 7,825,673 B2 * | 11/2010 | Nikawa | G01R 31/315 324/754.23 |
| 8,427,929 B2 | 4/2013 | Patland et al. | |
| 2006/0146328 A1 | 7/2006 | Decitre et al. | |
| 2010/0008153 A1 | 1/2010 | Lien et al. | |
| 2012/0134565 A1 * | 5/2012 | Gross | G01R 33/4828 382/131 |

FOREIGN PATENT DOCUMENTS

| | | |
|---|---|---|
| JP | S60-076650 A | 5/1985 |
| JP | H02-253152 A | 10/1990 |
| JP | H06-201654 A | 7/1994 |
| JP | H6-213976 A | 8/1994 |
| JP | 2001-343434 A | 12/2001 |
| JP | 2013-544352 A | 12/2013 |
| TW | 201432264 A | 8/2014 |
| WO | WO-2012/049538 A1 | 4/2012 |

OTHER PUBLICATIONS

David P. Pappas, "High Sensitivity Magnetic Field Sensor Technology overview", 2008.
International Preliminary Report on Patentability dated Aug. 24, 2017 for PCT/JP2016/053088.

* cited by examiner

Fig.10
(a) 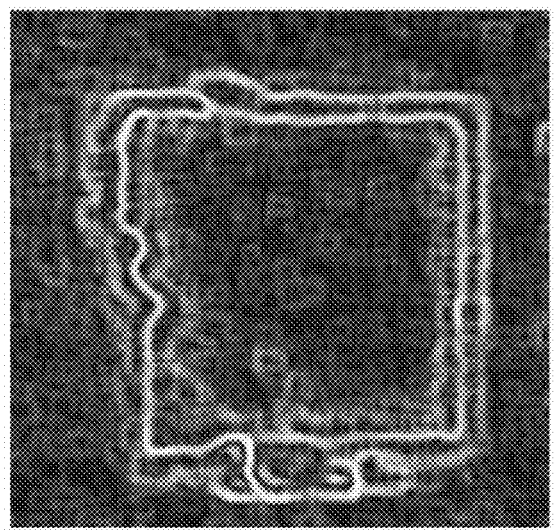
(b) 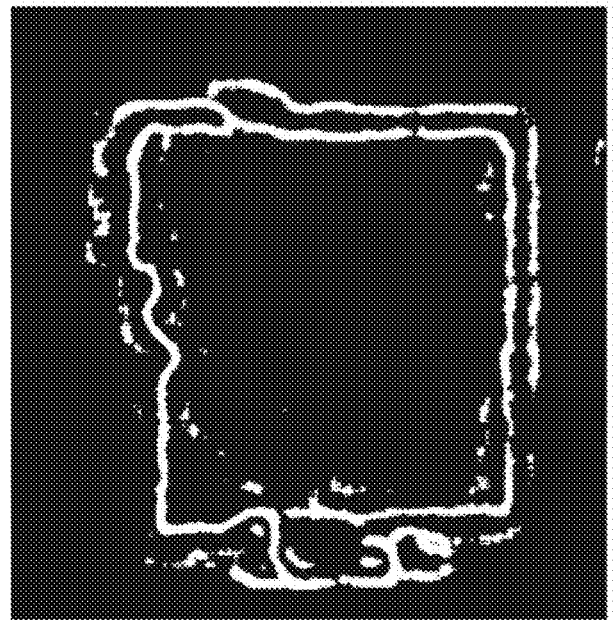

*Fig.11*
(a) 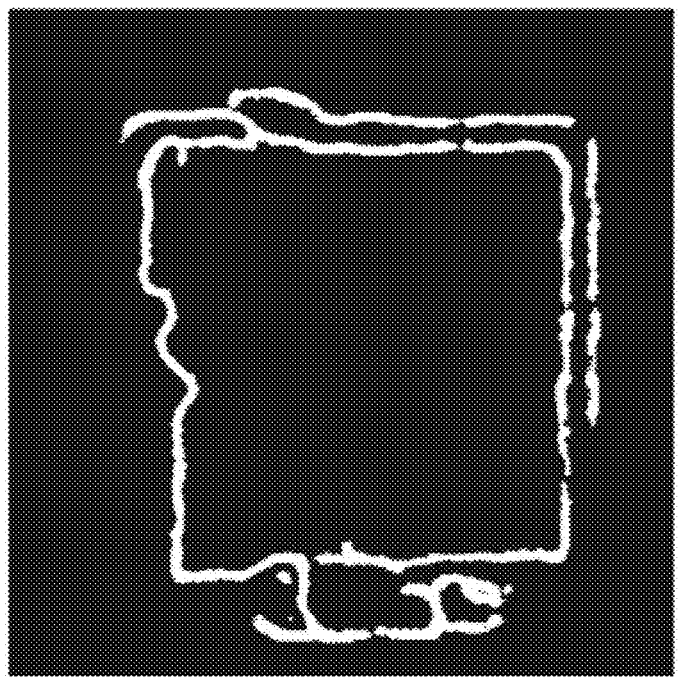
(b) 

*Fig.12*
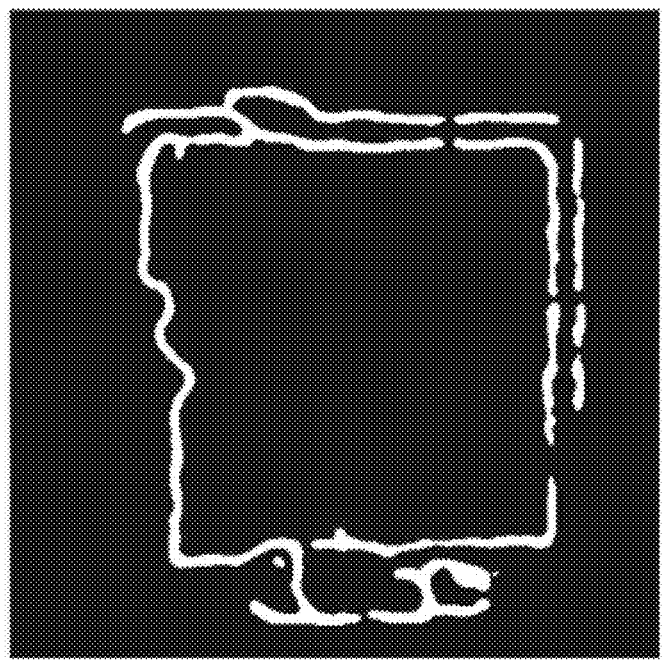
(a)
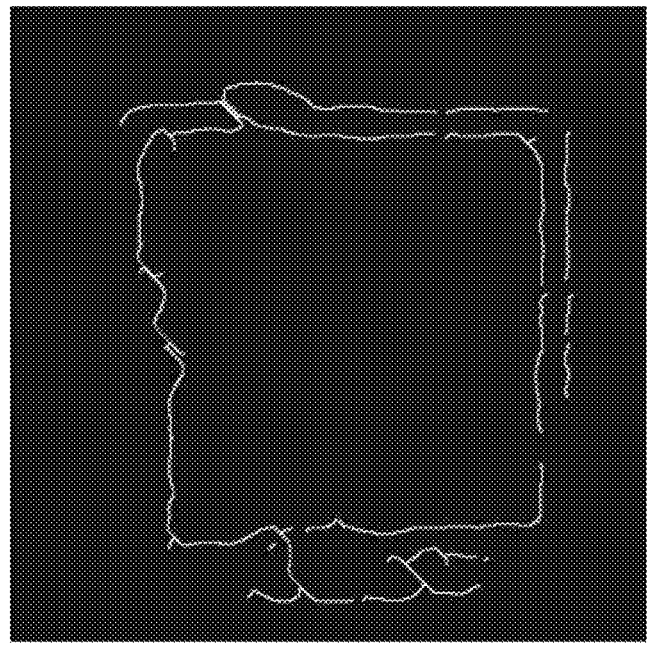
(b)

US 10,698,006 B2

INSPECTION METHOD AND INSPECTION APPARATUS

TECHNICAL FIELD

An aspect of the present invention relates to an inspection method and an inspection apparatus for an measurement target.

BACKGROUND ART

A technology for inspecting a measurement target includes an optical probing technology for irradiating a measurement target with light emitted from a light source and detecting measurement light (reflected light) from the measurement target using a light sensor to acquire a detection signal. In such an optical probing technology, a method of arranging a magneto-optical (MO) crystal to face a light irradiation surface of the measurement target and detecting reflected light according to a magneto-optical effect of the MO crystal to acquire the detection signal is known (for example, Patent Literature 1).

CITATION LIST

Patent Literature

[Patent Literature 1] Japanese Unexamined Patent Publication No. 2013-544352

SUMMARY OF INVENTION

Technical Problem

In Patent Literature 1 described above, a current path on a metal surface is acquired based on an amplitude (intensity) image indicating an amplitude (intensity of reflected light) of detected reflected light, and a fault portion on the metal is identified. Here, it is easy for the amplitude of the reflected light to change due to an influence of a noise component such as unevenness of a thickness of the magneto-optical crystal and scratches of the magneto-optical crystal. Therefore, in a method of acquiring a current path from an amplitude image, a current path cannot be accurately acquired in some cases. Therefore, an object of an aspect of the present invention is to provide an inspection method and an inspection apparatus capable of accurately acquiring a current path.

Solution to Problem

An inspection method according to an aspect is a method for acquiring a path of a current generated in a measurement target by applying a stimulus signal to the measurement target. The inspection method comprises steps of: applying the stimulus signal to the measurement target; irradiating a magneto-optical crystal disposed facing the measurement target with light; detecting light reflected from the magneto-optical crystal according to the irradiated light, and outputting a detection signal; generating phase image data based on a phase difference between a reference signal generated based on the stimulus signal and the detection signal, the phase image data including a phase component indicating the phase difference; and generating an image indicating a path of the current based on the phase image data.

Further, an inspection apparatus according to an aspect is an inspection apparatus for acquiring a path of a current generated in a measurement target by applying a stimulus signal to the measurement target. The inspection apparatus comprises: a signal application unit that applies the stimulus signal to the measurement target; a magneto-optical crystal that is disposed facing the measurement target; a light source that outputs light; an irradiation optical system that irradiates the magneto-optical crystal with the light output from the light source; a light detector that detects light reflected from the magneto-optical crystal according to the light radiated by the irradiation optical system, and outputs a detection signal; an analysis unit that generates phase image databased on a phase difference between a reference signal generated based on the stimulus signal and the detection signal, the phase image data including a phase component indicating the phase difference; and a current path image generation unit that generates an image indicating a path of the current based on the phase image data.

In the inspection method and the inspection apparatus, the stimulus signal is applied to the measurement target. Further, the detection signal is output based on the light reflected from the magneto-optic crystal arranged to face the measurement target. From the phase image data based on the phase difference between the reference signal based on the stimulus signal and the detection signal, an image indicating the path of the current is generated. For example, when the stimulus signal is applied to the measurement target, a current flows through the current path in the measurement target, and a magnetic field according to the current is generated. The magneto-optical crystal changes a polarization state of the reflected light according to the magnetic field of the measurement target. Therefore, a polarization state of the reflected light of the current path in the measurement target differs from a polarization state of reflected light of other portions. Accordingly, the detection signal according to the reflected light of the current path and the detection signal according to the reflected light of the other positions have different phase differences from the reference signal. Here, the phase difference between the detection signal according to the reflected light of the current path and the reference signal has a specific value. Specifically, the specific value is substantially one value from two values according to positive and negative directions in which a magnetic field generated according to the current passes through the magneto-optical crystal. On the other hand, a phase difference between the detection signal according to the reflected light in other portions and the reference signal does not have a specific value, but a random value. Therefore, the phase image data based on the phase difference includes a portion in which the phase difference has one value from two specific values, and a portion in which the phase difference has a random value. Accordingly, a portion indicating the path of the current, that is, the portion in which the phase difference has one value from two specific values, and a portion that is not the path of the current, that is, the portion in which the phase difference has a random value are clearly distinguished and shown in an image indicating the current path generated based on the phase image data, and the path of the current is accurately acquired. Further, information on such a phase difference is equivalent to digitization in the form of presence or absence of a signal, and it is difficult for the information to be changed according to an influence of a noise component such as unevenness of a thickness of the magneto-optical crystal and scratches of the magneto-optical crystal. Further, since the phase difference of the portion indicating the path of the current has one value from two specific values, it is easy for the current path to be identified and accuracy of the identification is improved. Thus, it is possible to accurately acquire the current path as compared with a case in which the current path is acquired according to an amplitude image.

Further, in the inspection method according to an aspect, the step of generating the image indicating the path of the current may include a step of generating statistical value image data indicating a statistical value of the phase component based on the phase image data, and generating the image indicating the path of the current based on the statistical value image data. Further, in the inspection apparatus according to an aspect, the current path image generation unit may generate statistical value image data indicating a statistical value of the phase component based on the phase image data, and generate the image indicating the path of the current based on the statistical value image data. The phase difference has two specific values in the current path portion. That is, the phase difference is biased in the current path portion. On the other hand, the phase difference has a random value in other portions. That is, the phase difference varies in other portions. Therefore, by performing statistical processing, it is possible to clarify a difference between the current path and a portion other than the current path and to accurately acquire the current path.

Further, in the inspection method and the inspection apparatus according to an aspect, the statistical value may be any one of variance, skewness, and kurtosis. Accordingly, it is possible to clarify a difference between the current path and a portion other than the current path and to accurately acquire the current path.

Further, in the inspection method according to an aspect, the step of generating the image indicating the path of the current may include a step of generating sine image data indicating a sine component and cosine image data indicating a cosine component based on the phase image data, and generating the image indicating the path of the current based on the sine image data and the cosine image data. Further, in the inspection apparatus according to an aspect, the current path image generation unit may generate sine image data indicating a sine component and cosine image data indicating a cosine component based on the phase image data, and generate the image indicating the path of the current based on the sine image data and the cosine image data. When the phase difference is $-\pi$ and when the phase difference is $+\pi$, luminance values are values that are actually continuously coupled to each other, but the luminance values becomes values distant from each other when the image is displayed as a phase component. In this regard, in the image data indicating the sine component or the cosine component of the phase component, the luminance values of the phase components according to the phase difference that are successively coupled to each other can be set to mutually close values. Thus, it is possible to accurately acquire the current path based on the phase image data. Further, since the image data of both of the sine component and the cosine component is generated, it is possible to increase the amount of information for generating the image indicating a path of the current, as compared with a case in which image data of only one of the sine component and the cosine component is generated. Thus, it is possible to acquire the current path more accurately.

Further, in the inspection method according to an aspect, the step of generating the image indicating the path of the current may include a step of performing calculation of any one of addition, multiplication, and a square root of sum of squares on the sine image data and the cosine image data. Further, in the inspection apparatus according to an aspect, the current path image generation unit may perform any one of addition, multiplication, and calculation of a square root of a sum of squares with the sine image data and the cosine image data. By performing the calculation, it is possible to appropriately generate an image indicating the path of the current by synergistically using both of the sine image data and the cosine image data.

Further, in the inspection method according to an aspect, the step of generating the image indicating the path of the current may include steps of: generating sine statistical value image data indicating a statistical value of the sine component based on the sine image data, generating cosine statistical value image data indicating a statistical value of the cosine component based on the cosine image data, and generating the image indicating the path of the current based on the sine statistical value image data and the cosine statistical value image data. Further, in the inspection apparatus according to an aspect, the current path image generation unit may generate sine statistical value image data indicating a statistical value of the sine component based on the sine image data, generate cosine statistical value image data indicating a statistical value of the cosine component based on the cosine image data, and generate the image indicating the path of the current based on the sine statistical value image data and the cosine statistical value image data. Accordingly, it is possible to accurately acquire the current path.

Further, in the inspection method and the inspection apparatus according to an aspect, the reference signal may be output from the signal application unit that applies the stimulus signal to the measurement target. Accordingly, it is possible to output a reference signal based on the stimulus signal easily and reliably.

Further, in the inspection method and the inspection apparatus according to an aspect, the reference signal may be output from the measurement target. Accordingly, it is possible to output the reference signal based on the stimulus signal easily and reliably.

In the inspection method and the inspection apparatus according to an aspect, the reference signal may be a signal having the same phase and period as the stimulus signal. Thus, by obtaining the phase difference between the reference signal and the detection signal, it is possible to easily obtain the phase difference between the stimulus signal and the detection signal.

Advantageous Effects of Invention

According to the inspection method and the inspection apparatus, it is possible to accurately acquire the current path.

BRIEF DESCRIPTION OF DRAWINGS

FIG. 10 is a diagram illustrating a finishing process.

FIG. 11 is a diagram illustrating a finishing process.

FIG. 12 is a diagram illustrating a finishing process.

DESCRIPTION OF EMBODIMENTS

Figure 1:
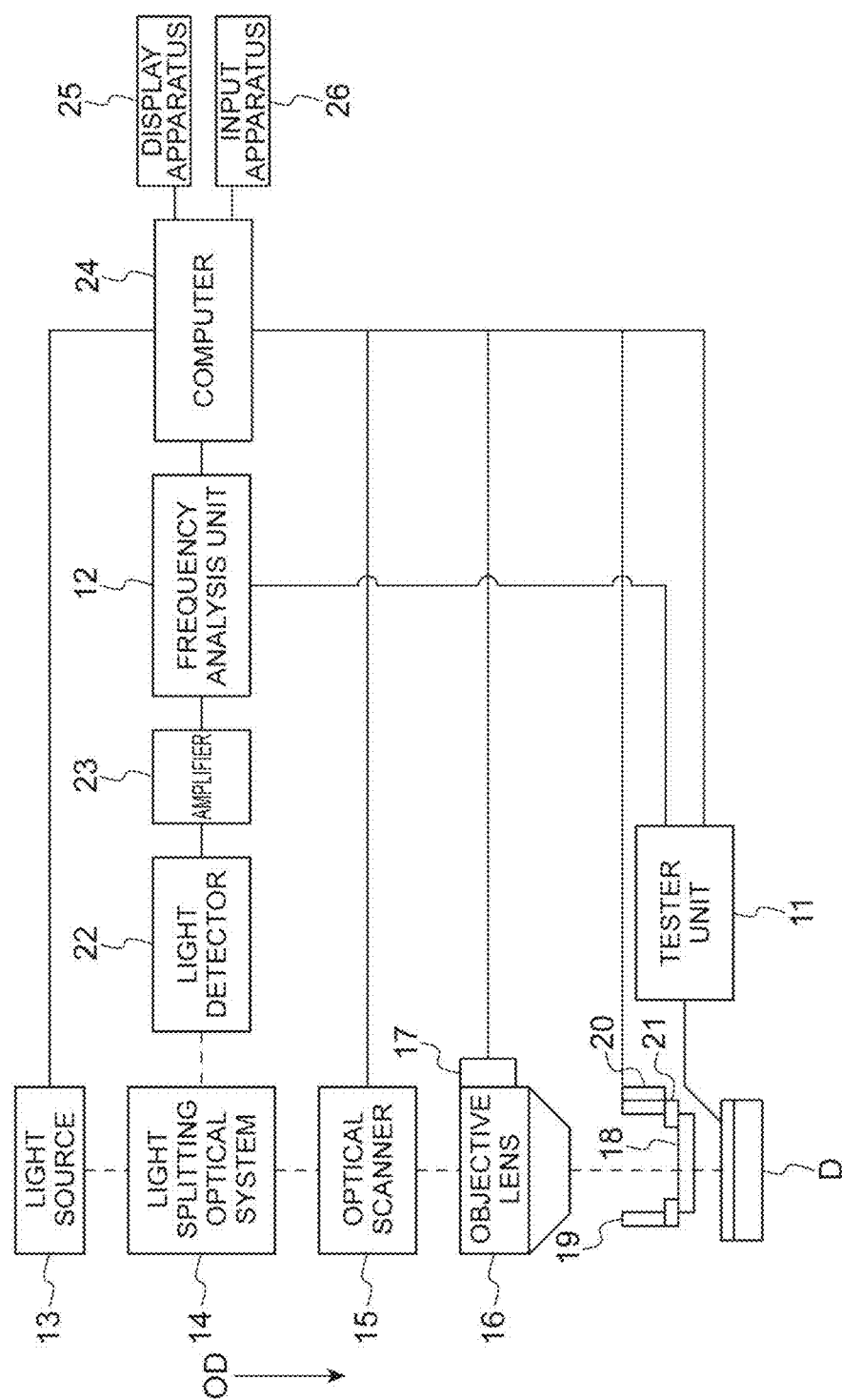
FIG. 1 is a configuration diagram of an inspection apparatus according to a first embodiment of the present invention.

Hereinafter, embodiments according to an aspect of the present invention will be described in detail with reference to the drawings. In the drawings, the same or corresponding portions are denoted by the same reference numerals, and repeated descriptions are omitted.

As illustrated in FIG. 1, an inspection apparatus 1 according to this embodiment is an apparatus for inspecting a semiconductor apparatus D that is an apparatus under test (DUT) serving as a measurement target, such as identifying an abnormality occurrence portion in the semiconductor apparatus D. More specifically, the inspection apparatus 1 acquires a path of a current generated in the semiconductor apparatus D by applying a stimulus signal to the semiconductor apparatus D and, for example, identifies the abnormality occurrence place in the semiconductor apparatus D.

Examples of the semiconductor apparatus D include an integrated circuit having a PN junction such as a transistor (for example, a small scale integration (SSI), a medium scale integration (MST), a large scale integration (LSI), a very large scale integration (VLSI), a ultra large scale integration (ULSI), a giga scale integration (GSI), a high current/high voltage MOS transistor or bipolar transistor, and a power semiconductor apparatus (power apparatus). Further, the measurement target may be not only the semiconductor apparatus D, but also may be, for example, a thin film transistor (TFT) such as an amorphous transistor formed on a glass surface, a polysilicon transistor, or an organic transistor, a package including a semiconductor apparatus, or a composite substrate.

A tester unit 11 (a signal application unit) is electrically coupled to the semiconductor apparatus D via an apparatus control cable. The tester unit 11 is operated by a power supply (not illustrated), and applies a predetermined modulated current signal (stimulus signal) to the semiconductor apparatus D. In the semiconductor apparatus D, a modulated magnetic field is generated according to the modulated current signal. By detecting an optical signal according to the modulated magnetic field using a light detector 22 to be described below, measurement light at a specific frequency can be detected. The inspection apparatus 1 may perform lock-in detection by causing light according to a detected frequency to be generated from a light source 13 (described below) while applying the modulated current signal from the tester unit 11 to the semiconductor apparatus D. In this case, it is possible to improve S/N of the inspection apparatus 1. The tester unit 11 is electrically coupled to a frequency analysis unit 12 via a timing signal cable. A modulation voltage signal may be applied as the stimulus signal.

The inspection apparatus 1 includes the light source 13. The light source 13 is operated by the power supply (not illustrated), and generates and outputs CW light or pulsed light with which an MO crystal 18 (magneto-optical crystal) to be described below and the semiconductor apparatus D are irradiated. The light output from the light source 13 may be incoherent (non-coherent) light or may be coherent light such as laser light. A super luminescent diode (SLD), an amplified spontaneous emission (ASE), a light emitting diode (LED), or the like can be used as the light source 13 that outputs incoherent light. When the light output from the light source 13 is incoherent light, interference noise generated between reflected light in the MO crystal 18 and reflected light in the semiconductor apparatus D can be reduced. The reflected light in the MO crystal 18 includes both of light reflected on a light incidence surface of the MO crystal 18 and light reflected on a light reflection surface of the MO crystal 18. An influence of the light reflected on the light incidence surface of the MO crystal 18 is reduced by performing an antireflection process on the light incidence surface.

Further, a solid laser light source, a semiconductor laser light source, or the like can be used as the light source 13 that outputs coherent light. A wavelength of the light output from the light source 13 is 530 nm or more and is, for example, 1064 nm or more. The light output from the light source 13 is guided to the light splitting optical system 14 via a polarization preserving single mode optical coupler (not illustrated) and a polarization preserving single mode optical fiber for probe light. Details of the light splitting optical system 14 will be described below. The light guided from the light source 13 to the light splitting optical system 14 is further guided to an irradiation optical system including an optical scanner 15 and an objective lens 16. The optical scanner 15 and the objective lens 16 which form the irradiation optical system irradiate the MO crystal 18 with the light output from the light source 13. The light source 13, the light splitting optical system 14, the optical scanner 15, the objective lens 16, and the MO crystal 18 are optically coupled.

The optical scanner 15 scans an irradiation spot on the light incidence surface of the MO crystal 18. More specifically, the optical scanner 15 scans the irradiation spot under control of a computer 24 to be described below. The optical scanner 15 includes, for example, an optical scanning element such as a galvano mirror or a micro electro mechanical system (MEMS) mirror.

The objective lens 16 focuses the light guided by the optical scanner 15 on the MO crystal 18. The objective lens 16 is configured such that switching can be performed between a low magnification objective lens and a high magnification objective lens by a turret (not illustrated) or the like. A magnification of the low magnification objective lens is, for example, five times, and a magnification of the high magnification objective lens is, for example, 50 times. An objective lens driving unit 17 is coupled to the objective lens 16. A focal position of the objective lens 16 can be adjusted by the objective lens driving unit 17 moving in an optical axis direction OD of the light from the light source 13.

The MO crystal 18 is arranged to face the semiconductor apparatus D. The MO crystal 18 has a refractive index changes according to the magnetic field generated in the semiconductor apparatus D due to a magneto-optical effect, and changes a polarization state (polarization direction) of the input light. For example, when a modulated current signal is applied to the semiconductor apparatus D at the time of failure of the semiconductor apparatus D, a current path through which a leak current according to a failure portion flows may be generated. In this case, a magnetic field in a portion in which a current path through which a leak current flows is generated is different from a magnetic field in a portion in which the current path through which a leak current flows is not generated. The MO crystal 18 outputs reflected light whose polarization direction has been changed according to such a change in the magnetic field. The difference in the polarization direction of the reflected light appears as a difference in intensity of the light acquired by the light detector 22 to be described below. The reflected light in the MO crystal 18 returns to the light splitting optical system 14 via the objective lens 16 and the optical scanner 15, and is guided to the light detector 22 via the optical fiber for returning light. The light splitting optical system 14 is optically coupled to the light detector 22.

Here, a holder 19 that holds the MO crystal 18 is coupled to the MO crystal 18 via a flexible member 21. The flexible member 21 is a ring-shaped elastic member configured to include, for example, a rubber or a spring. Further, the flexible member 21 may be a member whose shape is deformed and may not necessarily be the elastic member. The flexible member 21 is fixed to the MO crystal 18 to cover at least a portion of an outer edge of the MO crystal 18 when viewed in the optical axis direction OD. The flexible member 21 is fixed to a light incidence surface of the MO crystal 18. Further, the holder 19 has, for example, a ring shape and is fixed to the flexible member 21 to cover the outer edge of the flexible member 21 when viewed in the optical axis direction OD. Therefore, one surface of the flexible member 21 is fixed to the MO crystal 18, and the other surface thereof is fixed to the holder 19. Since the ring-shaped flexible member 21 covers the outer edge of the MO crystal 18 and the ring-shaped holder 19 covers the outer edge of the flexible member 21, an opening for input of light from the objective lens 16 is formed on the light incidence surface of the MO crystal 18 when viewed in the optical axis direction OD. The holder driving unit 20 is coupled to the holder 19.

The holder driving unit 20 moves in the optical axis direction OD to move the holder 19 in the optical axis direction OD. As the holder driving unit 20 moves in the optical axis direction OD, a distance between the holder 19 and the semiconductor apparatus D decreases and the MO crystal 18 is pressed against the semiconductor apparatus D. That is, the MO crystal 18 can be brought into contact with the semiconductor apparatus D. Light irradiation to the MO crystal 18 is performed in a state in which the MO crystal 18 is in contact with the semiconductor apparatus D. The irradiation the MO crystal 18 with the light is not limited to being performed in a state in which the MO crystal 18 is in contact with the semiconductor apparatus D and may be performed with a predetermined interval between the MO crystal 18 and the semiconductor apparatus D.

Here, when the MO crystal 18 is brought into contact with the semiconductor apparatus D, for example, the semiconductor apparatus D may be inclined with respect to a surface orthogonal to the optical axis. In this case, if the light incidence surface of the MO crystal 18 is not tilted with respect to the surface orthogonal to the optical axis or is negligibly tilted, a portion of the MO crystal precedes other portions and comes into contact with the semiconductor apparatus D. In this state, if the objective lens driving unit 17 further moves in the same direction, the flexible member 21 is bent so that the other portion of the MO crystal 18 follows tilt of the semiconductor apparatus D is and is pressed against the semiconductor apparatus D. The term "bend" refers to deformation due to bending, distorting, or stretching. That is, the flexible member 21 can be bent and the light incidence surface of the MO crystal 18 can be tilted with respect to a surface orthogonal to the optical axis. Accordingly, the semiconductor apparatus D and the MO crystal 18 can be brought into contact with each other or in close proximity to each other, and magnetic field characteristics generated in the semiconductor apparatus D can be appropriately measured using the MO crystal 18. A thickness, hardness, or the like of the flexible member 21 is selected so that a tilt angle of the light incidence surface of the MO crystal 18 with respect to the surface orthogonal to the optical axis is smaller than an opening angle of the objective lens 16 even when the flexible member 21 is bent and the light incidence surface of the MO crystal 18 is tilted. Accordingly, it is possible to reliably detect the light reflected by the MO crystal 18 using the objective lens 16.

The objective lens driving unit 17 and the holder driving unit 20 may have an integral configuration. In this case, the integral configuration may include a mechanism for individually moving the objective lens 16 and the holder 19. That is, for example, a slide mechanism in which separation into a mechanism for moving the objective lens 16 and the holder 19 together is performed, and the objective lens 16 and the holder 19 are individually moved may be included. After the MO crystal 18 and the semiconductor apparatus D are brought into contact with each other, it is necessary to move the objective lens 16 in the optical axis direction OD for focusing or the like. However, if both the objective lens 16 and the holder 19 are moved in the optical axis direction OD after the contact, excessive force may be applied to the MO crystal 18 and the semiconductor apparatus D. In this regard, after the MO crystal 18 and the semiconductor apparatus D are brought into contact with each other, the objective lens 16 can be moved relatively to the MO crystal 18 by separating the movement of the objective lens 16 from the movement of the holder 19.

The light detector 22 detects the reflected light in the MO crystal 18 that comes in contact with the semiconductor apparatus D according to the irradiation light and outputs a detection signal. The light detector 22 is, for example, a photodiode, an avalanche photodiode, a photomultiplier tube, an area image sensor, or the like. The light detector 22 includes at least one detector and detects intensity of the light input to the detector.

Figure 2:
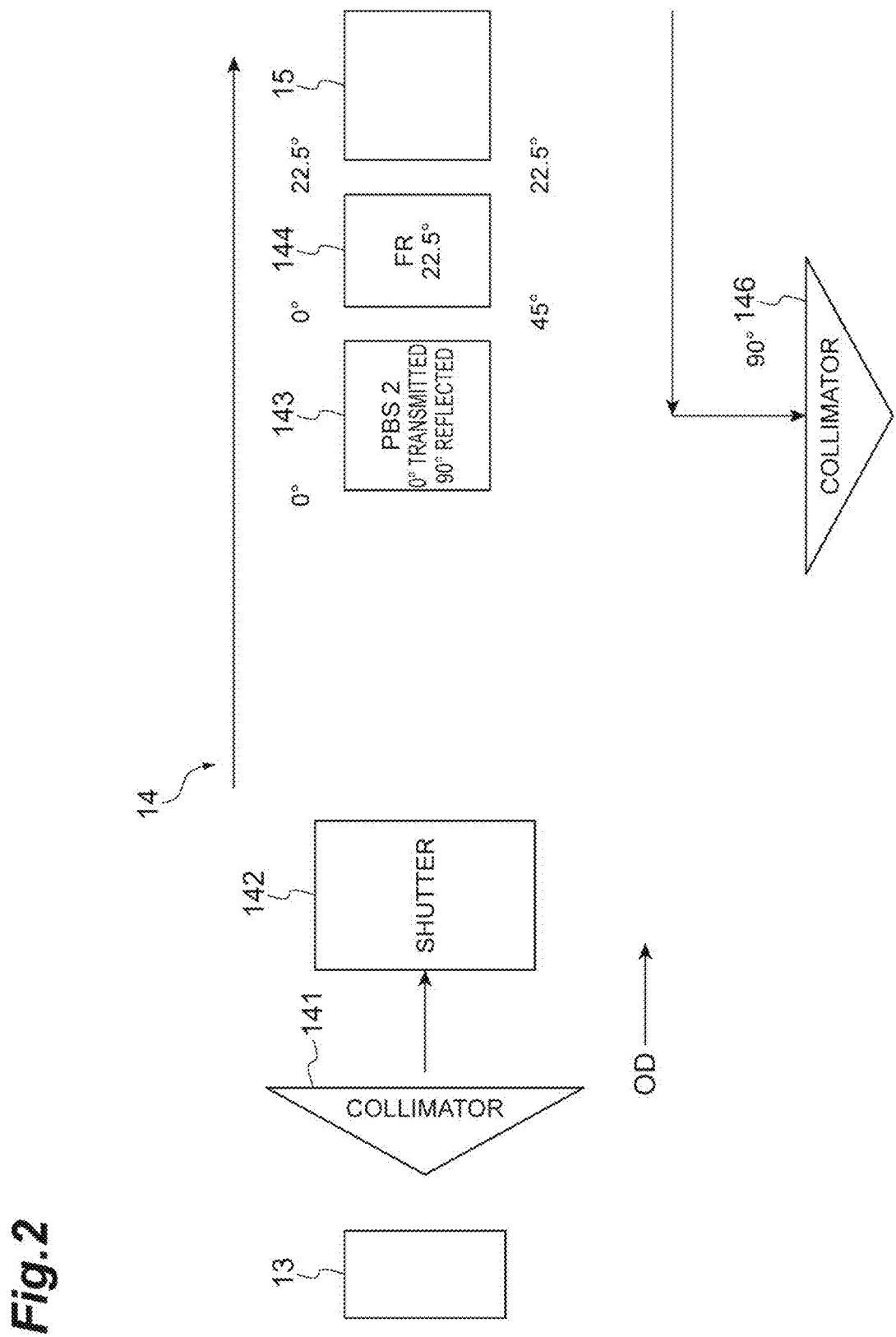
FIG. 2 is a diagram illustrating a light splitting optical system in the inspection apparatus of FIG. 1.

Here, the light splitting optical system 14 will be described with reference to FIG. 2. The light splitting optical system 14 includes collimators 141 and 146, a shutter 142, a polarization beam splitter (hereinafter referred to as a PBS) 143, a Faraday rotator (hereinafter referred to as an FR) 144. As illustrated in FIG. 2, when the MO crystal 18 is irradiated with light from the light source 13 via the optical scanner 15, the light from the light source 13 is first input to the shutter 142 via the collimator 141. The shutter 142 may be control ON/OFF of light. The light output from the shutter 142 is input to the PBS 143. The PBS 143 is set to transmit light having a polarization component of 0° and reflect light having a polarization component of 90°. Further, the PBS 143 is set according to the polarization of the light from the shutter 142. Therefore, the PBS 143 transmits the light from the shutter 142. The light having the polarization component of 0° transmitted through the PBS 143 is input to the FR 144 that tilts (rotates) the polarization plane of the input light by 22.5°, and the polarization component has 22.5°. The light transmitted through the FR 144 is input to the optical scanner 15 as light having a polarization component of 22.5°. The MO crystal 18 is irradiated with the light.

A polarization plane of the reflected light from the MO crystal 18 is rotated according to a Kerr effect proportional to the magnetic field (magnetic field intensity) generated by the modulated current signal applied to the semiconductor apparatus D. The polarization plane of the reflected light is tilted by 22.5° by the FR 144 and input to the PBS 143. The reflected light is divided into light having the polarization component of 90° and light having a polarization component of 0° by the PBS 143. The light having the polarization component of 90° is reflected by the PBS 143 and input to the light detector of the light detector 22 via the collimator 146. Thus, the light detector 22 detects, as the light intensity, a change in the polarization plane according to the magnetic field (magnetic field intensity) generated in the semiconductor apparatus D, and outputs a detection signal with intensity (amplitude) according to the light intensity to the amplifier 23. Although the configuration in which only one PBS 143 is included as the light splitting optical system 14 and only light with the polarization component of 90° among orthogonal beams of linearly polarized light is detected has been described, the present invention is not limited thereto. That is, the light splitting optical system 14 may have a configuration in which an FR that tilts the polarization plane of the input light by 45° between the PBS 143 and the FR 144, a PBS that transmits light having a polarization component of 45° and reflects light having a polarization component of 135°, and a collimator are further included, and both of linearly polarized beams of light orthogonal to each other, that is, light having a polarized light component of 90° and the light having a polarized light component of 0° are captured and differentially detected. The light splitting optical system 14 may have a half mirror even though efficiency of use of light decreases.

Returning to FIG. 1, the amplifier 23 amplifies the detection signal output by the light detector 22 and outputs the amplified detection signal. The detection signal after the amplification is input to the frequency analysis unit 12. The light detector 22 is electrically coupled to the amplifier 23 and the frequency analysis unit 12. As the frequency analysis unit 12, a lock-in amplifier, a spectrum analyzer, a digitizer, a cross-domain analyzer (registered trademark), or the like is used. The frequency analysis unit 12 extracts a measurement frequency component of the detection signal after amplification. The measurement frequency is set, for example, based on the modulation frequency of the modulated current signal applied to the semiconductor apparatus D. Further, the frequency analysis unit 12 acquires the reference signal having the same cycle as the modulated current signal that is applied to the semiconductor apparatus D. The reference signal, for example, is output from the tester unit 11 and input to the frequency analysis unit 12. The tester unit 11 and the frequency analysis unit 12 are electrically coupled to each other.

Figure 3:
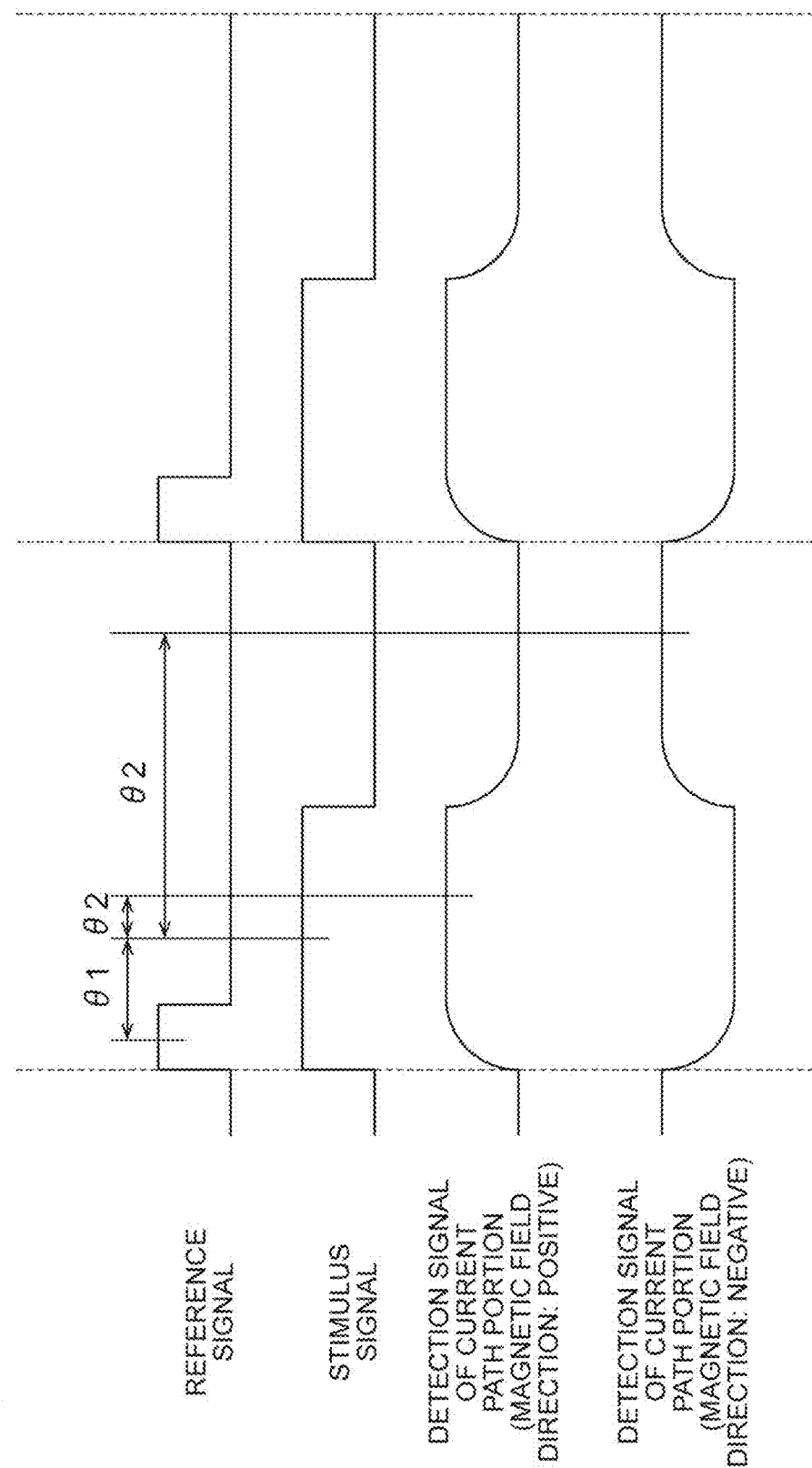
FIG. 3 is a diagram illustrating a phase difference.

The frequency analysis unit 12 derives a phase difference between the detection signal from which the measurement frequency component has been extracted and the acquired reference signal. As described above, the amplitude of the detection signal varies according to the magnetic field (magnetic field intensity) generated by the semiconductor apparatus D. There is a correlation relationship between the amplitude and the phase. Therefore, the frequency analysis unit 12 can identify the phase difference between the detection signal and the reference signal based on the amplitude of the detection signal. Here, the phase difference between the detection signal and the reference signal according to the reflected light of the current path portion has a specific value. Specifically, the specific value substantially has one value in two values according to the positive or negative direction in which the magnetic field generated according to the current passes through the MO crystal 18. As illustrated in FIG. 3, the reference signal has the same cycle as the stimulus signal due to the frequency analysis unit 12. Further, the phase difference between the detection signal and the reference signal in the current path portion (hereinafter also referred to as the current phase difference) is constant over a plurality of cycles. Specifically, the current phase difference is a value obtained by adding a phase difference θ1 between the reference signal and the stimulus signal and a phase difference θ2 between the stimulus signal and the detection signal. The phase difference θ1 can be varied by setting of the frequency analysis unit 12 that generates the reference signal. To obtain the current phase difference more easily, the phase of the reference signal and the phase of the stimulus signal may be the same, and the phase difference θ1 may be 0. The phase difference θ2 has one value in two values with a 180° (π) difference according to a positive or negative direction in which the magnetic field generated according to the current passes through the MO crystal. That is, the phase difference θ2 between the detection signal and the stimulus signal in the current path portion in which the magnetic field direction is positive and the phase difference θ2 between the detection signal and the stimulus signal in the current path portion in which magnetic field direction is negative has a 180 (π) difference. On the other hand, the phase difference between the detection signal and the reference signal in a non-current path portion in the semiconductor apparatus D has a random value rather than the specific value. Accordingly, it can be estimated (acquired) whether or not a path is the current path based on whether the phase difference has two specific values (details will be described below). The frequency analysis unit 12 outputs an analysis signal including information indicating an identified phase difference to the computer 24 (an analysis unit or a current path image generation unit). The frequency analysis unit 12 and the computer 24 are electrically coupled.

The computer 24 is, for example, a PC or the like. An input apparatus 26 such as a keyboard, a mouse, or the like to which measurement conditions or the like is input from a user, and a display apparatus 25 such as a display for indicating a measurement result or the like to the user are coupled to the computer 24. The computer 24 includes a central processing unit (CPU) that is a processor, and a random access memory (RAM) or a read only memory (ROM) that is a recording medium. The computer 24 executes the following functions using the CPU. The computer 24 has a function of controlling the light source 13, the optical scanner 15, the objective lens driving unit 17, the tester unit 11, the light detector 22, and the frequency analysis unit 12, and the like. The computer 24 estimates (acquires) the current path in the semiconductor apparatus D based on an analysis signal output from the frequency analysis unit 12. Specifically, the computer 24 generates phase image data including the phase component indicating the phase difference based on the phase difference between the detection signal and the reference signal included in the analysis signal. Further, the computer 24 generates an image (current path image) indicating the current path based on the phase image data to estimate the current path.

The computer 24 first maps the phase component to each irradiation spot based on the phase difference (phase component) included in the analysis signal and information on the irradiation spot on the light incidence surface of the MO crystal 18 to create the phase image. The phase image is an image (phase image) obtained by mapping the phase difference to a predetermined luminance value according to the phase difference. In a correspondence relationship between the phase difference and the luminance value, for example, the luminance value is 0 a.u. when the phase difference is −π, the luminance value is 16000 a.u. when the phase difference is zero, and the luminance value is 32000 a.u. when the phase difference is +π. The computer 24 generates phase image data including the phase component corresponding to each irradiation spot. In the phase image data, the phase component corresponding to each irradiation spot is mapped to a position in the image in consideration of the position of each illumination spot.

The computer 24 generate statistical value image data indicating a statistical values of the phase component based on the generated phase image data, and generates the current path image based on the statistical value image data. The statistical value is, for example, dispersing, skewness, kurtosis, or the like. In the phase image data, the luminance value of a non-current path portion is a random value, whereas the luminance value of the current path portion is two specific values. That is, the luminance value is biased in the current path portion, and varies in a non-current path portion. Therefore, if the dispersion, the skewness, the kurtosis, or the like that is a statistical value of the phase component is calculated, it is possible to clarify the difference between the current path portion and the non-current path portion. Accordingly, the computer 24 calculates a statistical value of the phase component based on the phase image data. Hereinafter, an example in which the computer 24 calculates the skewness as a statistical value.

Figure 4:
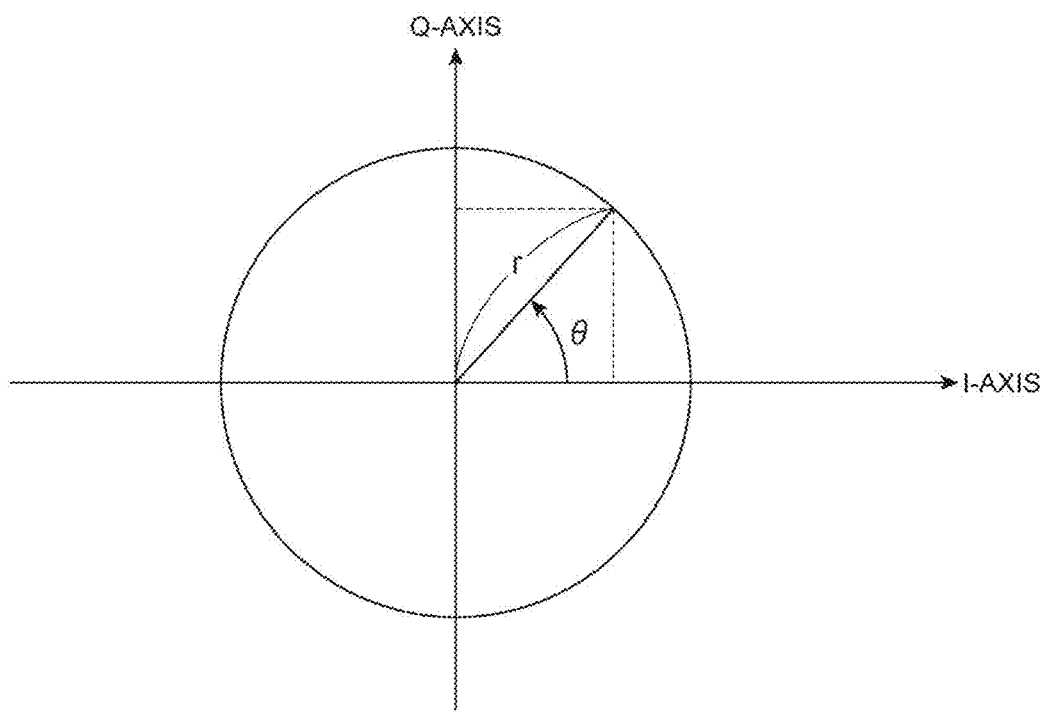
FIG. 4 is a diagram illustrating projection of a phase difference onto an I-axis and a Q-axis.

To calculate the skewness of the phase component, it is necessary to obtain an average luminance value of a predetermined area (a predetermined number of pixels in a predetermined area) in the phase image data (which will be described in detail below). Here, in a case where the phase difference is −π and a case where the phase difference is +π, the phase differences are mutually continuous value. However, when the luminance values are shown as a phase image, the luminance values are greatly different from each other. That is, when the luminance value is −π, the luminance value is 0 a.u. and when the luminance value is +π, the luminance value is 32000 a.u. Thus, since the luminance values may have greatly different values even though the phase differences have close values, the skewness of the phase component according to the actual phase difference cannot be calculated when an average luminance value is simply obtained from the phase component in some cases. Therefore, the computer 24 generates an I-axis image (cosine image data) indicating an in-phase component (a cosine component or an I-axis component) included in the phase component, and a Q-axis image (sine image data) indicating a quadrature phase component (a sine component or a Q-axis component). That is, as illustrated in FIG. 4, an I-axis image and an Q-axis image are generated by projecting the phase difference θ onto the I-axis (cos axis) and the Q-axis (sin axis). Projecting the phase difference θ onto the I-axis or the Q-axis refers to obtaining an I-axis component and a Q-axis component from the phase difference θ and the intensity component (amplitude). A normalized integer 1, for example, may be used as the intensity component r or an actually detected value of the amplitude may be used. The computer 24 generates statistical value image data for each of the I-axis image and the Q-axis image and generates a current path image.

Figure 5:
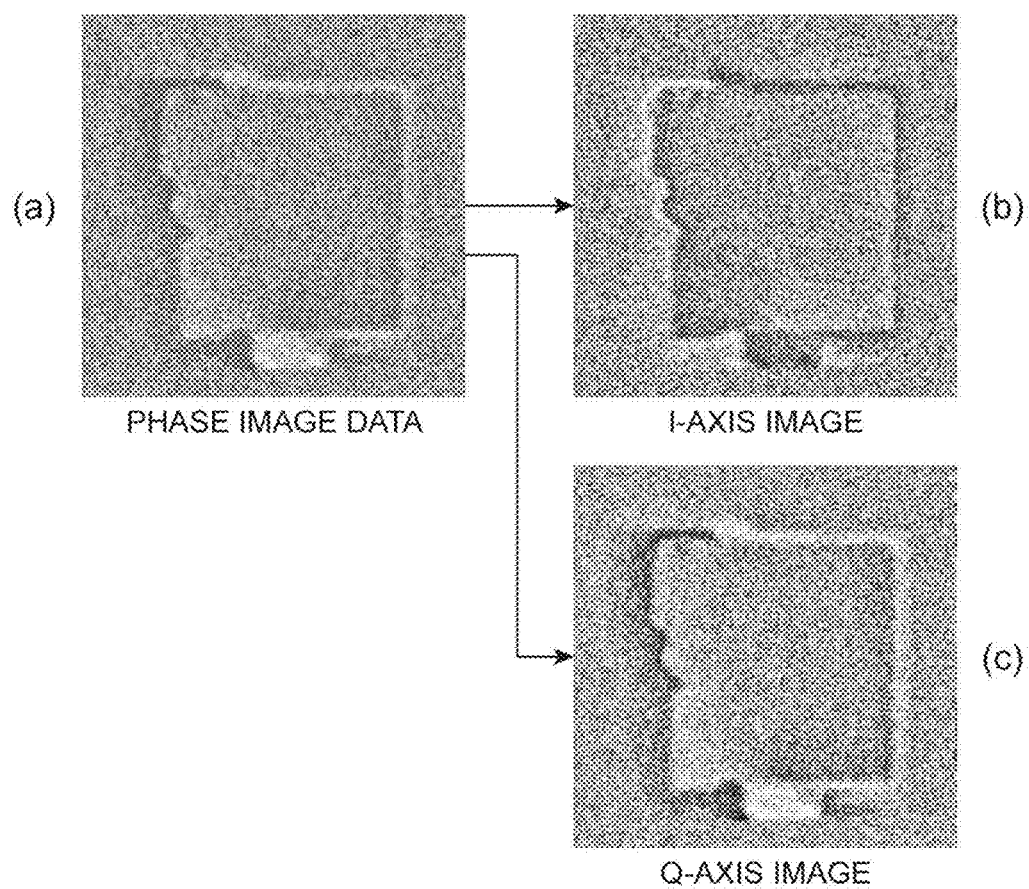
FIG. 5 is a diagram illustrating a procedure for estimating a current path from a phase image (phase image data).
Figure 6:
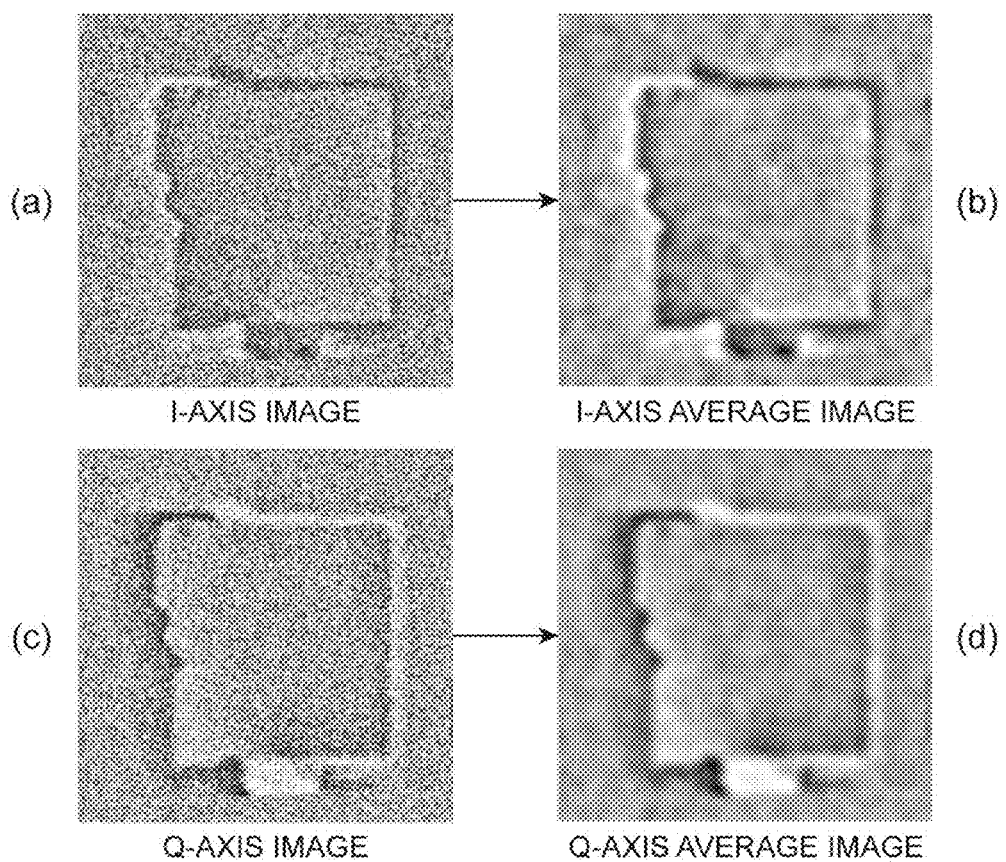
FIG. 6 is a diagram illustrating a procedure for estimating a current path from a phase image (phase image data).

A procedure for estimating the current path from the phase image data will be described with reference to FIGS. 5 to 9. In FIG. 5(a), a phase image created based on the phase image data is illustrated. Specifically, the phase image illustrated in FIG. 5(a) is an image in which a phase component corresponding to each irradiation spot is mapped as a luminance value. The computer 24 obtains the I-axis component and the Q-axis component of the phase component and generates the I-axis image (FIG. 5(b)) and the Q-axis image (FIG. 5(c)) for each pixel of the phase image data (that is, for each acquired luminance value (phase component) of each illumination spot). Further, the computer 24 calculates an average luminance value obtained by averaging the luminance values of the pixels near each pixel for each pixel of the I-axis image and generates an I-axis average image in which the average luminance value of each pixel is mapped, as illustrated in FIGS. 6(a) and 6(b). Similarly, the computer 24 calculates the average luminance value obtained by averaging the luminance values of the pixels near each pixel for each pixel of the Q-axis image and generates a Q-axis average image in which the average luminance value of each pixel is mapped, as illustrated in FIGS. 6(c) and 6(d). The pixels near each pixel is a pixel included in an area of a small area around each pixel and is, for example, a pixel included in the 9×9 pixels around each pixel. The area of the small area is not limited to 9×9 pixels and may be an arbitrary n×n pixels (n is an integer equal to or greater than 2). In this case, by setting n to an odd number, a pixel at which the average luminance value is desired to be obtained is set as a center, but the present invention is not limited thereto and n may be an even number.

Figure 7:
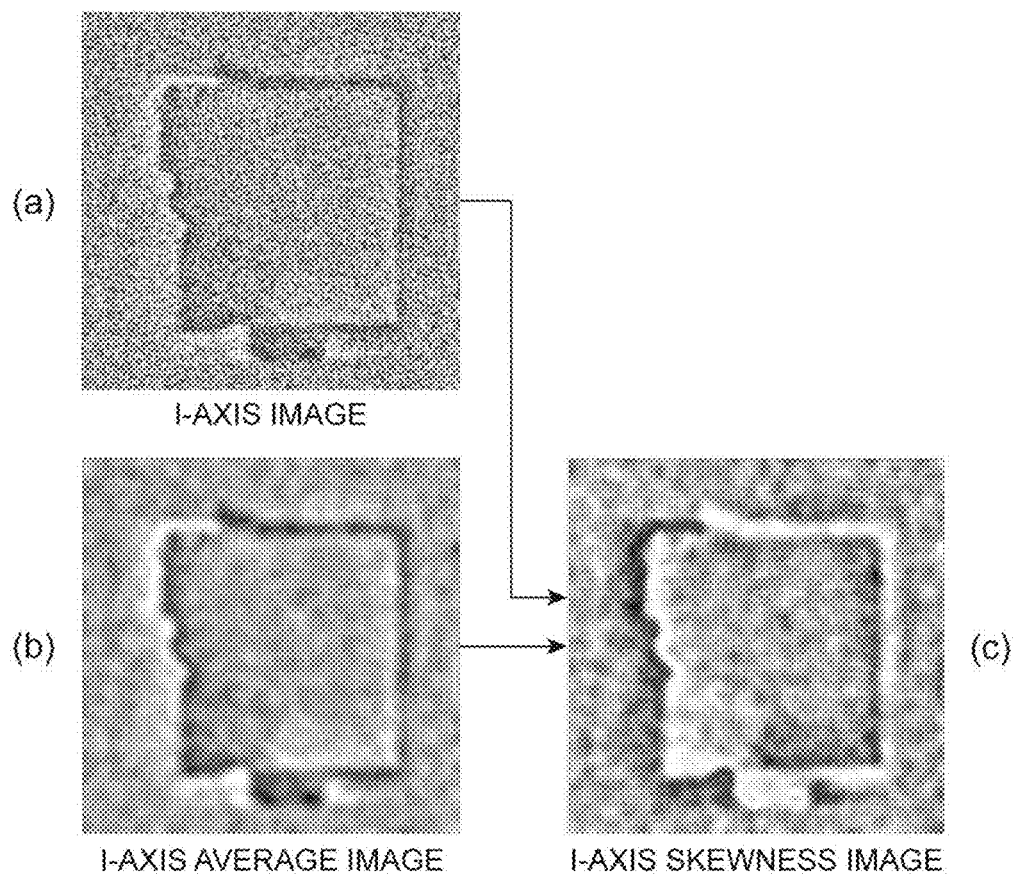
FIG. 7 is a diagram illustrating a procedure for estimating a current path from a phase image (phase image data).
Figure 8:
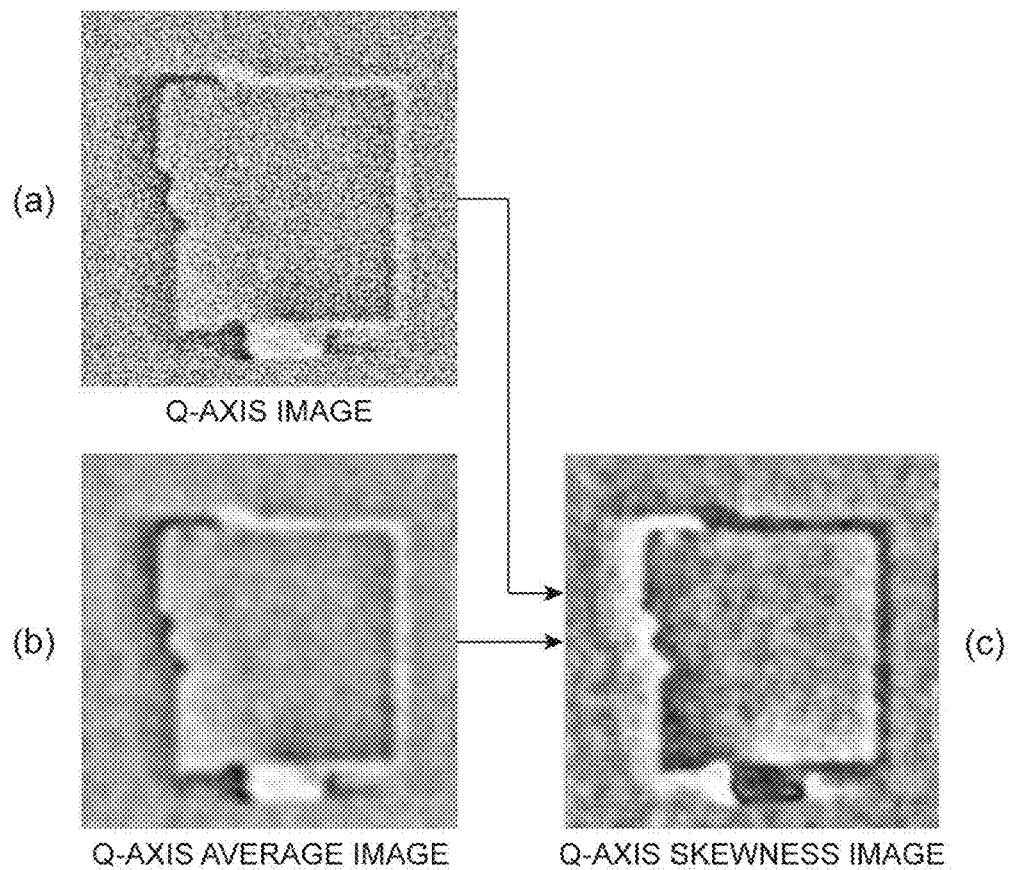
FIG. 8 is a diagram illustrating a procedure for estimating a current path from a phase image (phase image data).

Further, the computer 24 generates I-axis statistical value image data indicating the statistical value of the I-axis component based on the I-axis image, generates Q-axis statistical value image value indicating the statistical value of the Q-axis component based on the Q-axis image, and generates a current path image based on the I-axis statistical value image data and the Q-axis statistical value image data. Specifically, the computer 24 calculates the skewness of each pixel from the I-axis image and the I-axis average image, and generates an I-axis skewness image (I-axis statistical value image data) to which the skewness of each pixel has been mapped, as illustrated in FIG. 7. Similarly, the computer 24 calculates the skewness of each pixel from the Q-axis image and the Q-axis average image, and generates a Q-axis skewness image (Q-axis statistical value image data) to which the skewness of each pixel has been mapped, as illustrated in FIG. 8. For example, as a procedure for calculating the skewness of each pixel, the skewness may be calculated from the luminance value of the pixel included in a small area of the I(Q)-axis image and an average luminance value of an I(Q)-axis average image corresponding to a center pixel of a small area of the I(Q)-axis image.

Figure 9:
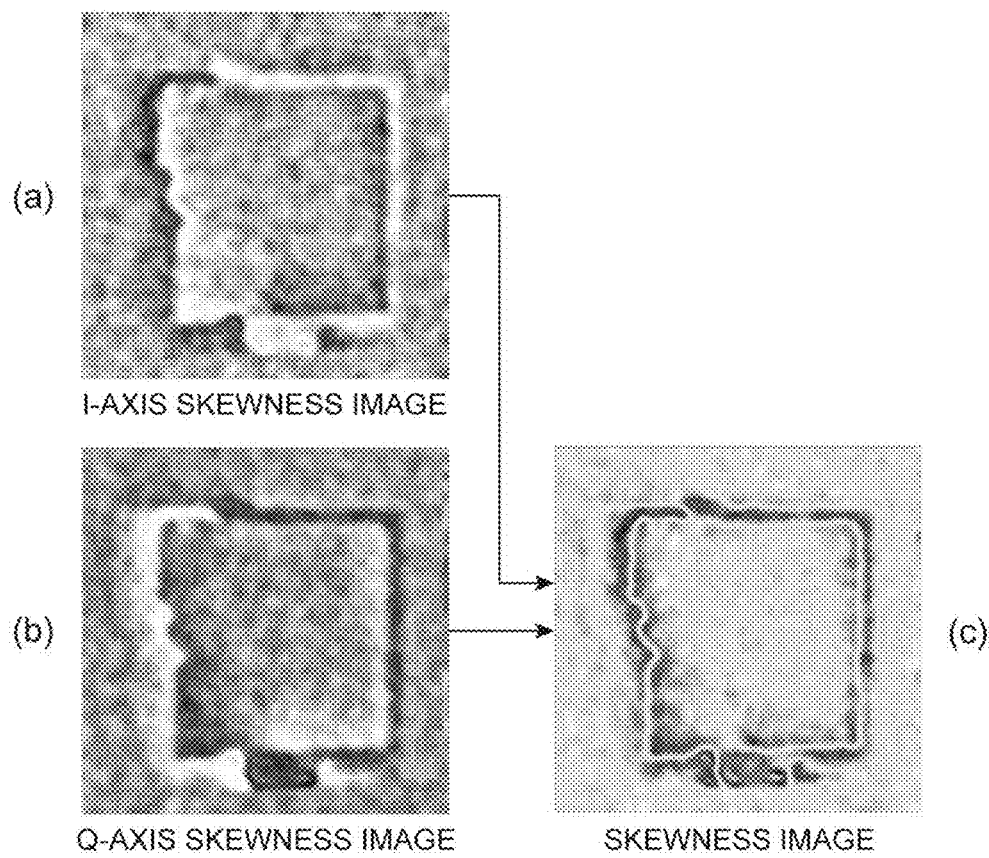
FIG. 9 is a diagram illustrating a procedure for estimating a current path from a phase image (phase image data).

Finally, the computer 24 generates a skewness image (FIG. 9(c)) from the I-axis skewness image and the Q-axis skewness image, as illustrated in FIG. 9. The skewness image is a current path image. Only the I-axis skewness image and the Q-axis skewness image may be generated instead of generating the skewness image, and the current path may be estimated from the I-axis skewness image and the Q-axis skewness image. In this case, the I-axis skewness image and the Q-axis skewness image form the current path image. Specifically, the computer 24 multiplies the I-axis skewness image by the Q-axis skewness image to generate the skewness image. Multiplying the I-axis skewness image by the Q-axis skewness image refers to multiplying the luminance value $i_{stat}$ of each pixel of the I-axis skewness image by the luminance value $q_{stat}$ each pixel of the Q-axis skewness image corresponding to each pixel, as shown in Equation (1) below.

[Math. 1]

$$i_{stat} \times q_{stat} \tag{1}$$

The computer 24 may add the I-axis skewness image and the Q-axis skewness image to generate a skewness image. Adding the I-axis skewness image and the Q-axis skewness image refers to the luminance value $i_{stat}$ of each pixel of the I-axis skewness image and the luminance value $q_{stat}$ of each pixel of the Q-axis skewness image corresponding to each pixel, as illustrated in Equation (2) below.

[Math. 2]

$$i_{stat} + q_{stat} \quad (2)$$

Further, the computer 24 may calculate a square root of sum of squares of the I-axis skewness image and the Q-axis skewness image to generate a skewness image. Calculating a square root of sum of squares of the I-axis skewness image and the Q-axis skewness image refers to calculating the square root of the sum of squares of the luminance value $i_{stat}$ of each pixel of the I-axis skewness image and the luminance value $q_{stat}$ of each pixel of the Q-axis skewness image corresponding to each pixel, as illustrated in Equation (3) below. Further, the square root of sum of squares may be calculated in a case as shown in Equation (4) below using a sign function sgn (x) of returning +1 if x is positive (x>0), −1 if x is negative (x<0), and 0 if x=0.

[Math. 3]

$$\sqrt{i_{stat}^2 + q_{stat}^2} \quad (3)$$

[Math. 4]

$$\operatorname{sgn}(i_{stat} \times q_{stat}) \times \sqrt{i_{stat}^2 + q_{stat}^2} \quad (4)$$

The computer 24 may appropriately perform a finishing process such as shading removal, binarization, removal of dust in the image, smoothing, and thinning on the current path image (that is, the skewness image or the I-axis skewness images and the Q-axis skewness image) to improve visibility of a measurer so that the current path can be estimated more favorably. The finishing process performed by the computer 24 will be described with reference to FIGS. 10 to 12.

The shading removal is a process of reducing luminance unevenness from an image with luminance unevenness. As illustrated in FIG. 9(c), in a current path image before shading removal, a luminance value of the pixel near an edge may be reduced (reduction in luminance occurs), and the luminance unevenness may occur. In this case, it becomes difficult for the current path and the other portion to be clearly distinguished upon binarization. Therefore, the computer 24 increases a pixel having a minimum luminance value among the pixels near each pixel (for example, n×n pixels around each pixel) by a predetermined value. Thus, as illustrated in FIG. 10(a), luminance unevenness of the current path image is reduced as compared to an image before shading removal.

The binarization is a process of obtaining a binary image converted from an image with various luminances (a grayscale image) to two gradations of white and black. By performing the binarization, it is possible to improve contrast of the current path. The computer 24 compares each pixel with a predetermined threshold value and displays pixels above the threshold value in white and pixels below the threshold value in black. The computer 24 may derive, for example, a minimum value and maximum value among luminance values of the respective pixels, sets a range from the minimum value to the maximum value to 100%, and sets the luminance value of 45% to the predetermined threshold value described above. Through the binarization, a binary image illustrated in FIG. 10(b) is generated.

The removal of the dust in the image is a process of removing an area having a small area difficult to be considered to be the current path, and is a process of removing unnecessary portions in estimation of the current path. The computer 24 recognizes, for example, a plurality of lumps (area) of the pixels displayed in white using a known boundary tracking algorithm. The computer 24 recognizes the area having a small size that is an area of which a width and a height are equal to or smaller than a predetermined value among the areas as dust in the image, and removes the dust in the image (FIG. 11(a)).

The computer 24 smoothes the image from which dust has been removed (FIG. 11(b)). As a filter for performing smoothing, for example, a smoothing filter such as a spatial filter can be used. The computer 24 compares each pixel of the image subjected to smoothing with a predetermined threshold value again to perform performs binarization. The computer 24, for example, derives a minimum value and a maximum value among the luminance values of the respective pixels, sets a range from the minimum value to the maximum value to 100%, and sets the luminance value of 50% as the predetermined threshold value described above. By performing the binarization again in this manner, a binary image illustrated in FIG. 12(a) is generated.

Further, the computer 24 thins the binary image generated by the re-binarization (FIG. 12(b)). The thinning is a process of converting the binary image, for example, into a line image with a width of one pixel. A line considered to be the current path is thinned by the thinning. Thinning is performed by a known thinning algorithm. A thinning process may be performed on the image from which the dust has been removed (FIG. 11(a)) without performing the smoothing and the re-binarization described above. However, smoothness of a line segment is improved by performing the smoothing and the re-binarization described above.

Next, an operation and effects of the inspection apparatus 1 according to this embodiment will be described.

In an optical probing technology of the related art, there is a technology for acquiring a current path of a measurement target based on an amplitude (intensity) image indicating an amplitude of detected reflected light and identifying a fault portion of the measurement target. However, the amplitude of the reflected light is easily changed due to an influence of a noise component such as unevenness of a thickness of a magneto-optical crystal and scratches of the magneto-optical crystal. Therefore, an SN ratio of the amplitude image is easily deteriorated. Thus, in a method of acquiring the current path from the amplitude image, the current path cannot be accurately acquired in some cases.

In this respect, in the inspection apparatus 1, an image indicating the path of the current is generated from the phase image data based on the phase difference between the reference signal based on the stimulus signal and the detection signal. For example, when a stimulus signal is applied from the tester unit 11 to the semiconductor apparatus D, a current flows in the current path of the semiconductor apparatus D, and a magnetic field according to the current is generated. The MO crystal 18 changes a polarization state of the reflected light according to the magnetic field of the semiconductor apparatus D. Therefore, a polarization state of the reflected light of the current path in the semiconductor apparatus D and a polarization state of the reflected light of other portions (portions in which no current flows) are different from each other. Accordingly, the detection signal according to the reflected light of the current path and the detection signal according to the reflected light of the other positions have a different phase difference with the reference signal.

Here, the phase difference between the detection signal according to the reflected light of the current path and the reference signal has a specific value. Specifically, the specific value is substantially one value from two values according to positive and negative directions in which a magnetic field generated according to the current passes through the MO crystal 18. On the other hand, a phase difference between the detection signal according to the reflected light in other portions and the reference signal does not have a specific value, but a random value. Therefore, the phase image data based on the phase difference includes a portion in which the phase difference has one value from two specific values, and a portion in which the phase difference has the random value. Therefore, a portion indicating the path of the current, that is, the portion in which the phase difference has one value from two specific values, and a portion that is not the path of the current, that is, the portion in which the phase difference has the random value are clearly shown in the current path image generated based on the phase image data, and the path of the current can be accurately acquired. It is difficult for information on such a phase difference to be changed according to an influence of a noise component such as unevenness of a thickness of the MO crystal 18 and scratches of the MO crystal 18. Further, since the phase difference of the portion indicating the path of the current has one value from two specific values, it is easy for the current path to be identified and accuracy of the identification is improved. Thus, it is possible to accurately acquire the current path as compared with a case in which the current path is acquired according to the amplitude image.

Further, the computer 24 generates statistical value image data indicating the statistical value of the phase component based on the phase image data, and generates the current path image based on the statistical value image data. Specifically, the computer 24 calculates any one of variance, skewness, and kurtosis as the statistical value. In the phase image data, the luminance value of non-current path portion is a random value, whereas the luminance value of the current path portion is two specific values. That is, the luminance value is biased in the current path portion, and the luminance value varies in non-current path portion. Therefore, if the dispersion, the skewness, the kurtosis, or the like that is a statistical value of the phase component is calculated, it is possible to clarify a difference between the current path portion and a non-current path portion. Thus, it is possible to accurately acquire the current path.

Further, the computer 24 generates an I-axis image (cosine image data) indicating an in-phase component (an cosine component or an I-axis component) and a Q-axis image (sine image data) indicating a quadrature phase component (a sine component or a Q-axis component) and generate the current path image based on the I-axis image and the Q-axis image. When the phase difference is $-\pi$ and when the phase difference is $+\pi$, the luminance values are values that are actually successively coupled to each other, but when the luminance values becomes distant values when the image is displayed as a phase image. In this regard, in the image data indicating the sine component or the cosine component of the phase component, the luminance values of the phase components according to the phase difference that are successively coupled to each other can be set to mutually close values. Thus, it is possible to accurately acquire the current path based on the phase image data. Further, since the image data of both of the sine component and the cosine component is generated, it is possible to increase the amount of information for generating an image indicating a path of the current, as compared with a case in which image data of only one of the sine component and the cosine component is generated. Thus, it is possible to acquire the current path more accurately.

Further, the computer 24 performs a calculation of any one of addition, multiplication, and square root of sum of squares on the I-axis image and the Q-axis image. By performing the calculation, it is possible to appropriately generate the current path image by using data of both of the I-axis image and the Q-axis image synergistically.

Further, the computer 24 generates sine statistical value image data indicating the statistical value of the sine component (quadrature phase component) based on the sine image data, generates cosine statistical value image data indicating the statistical value of the cosine component (in-phase component) based on the cosine image data, and generates a current path image based on the sine statistical value image data and the cosine statistical value image data. Thus, it is possible to acquire the current path more accurately.

Further, since the reference signal is output from the tester unit 11 that applies the stimulus signal to the semiconductor apparatus D, it is possible to output a reference signal based on the stimulus signal easily and reliably. The reference signal may be a signal having the same phase and cycle as those of the stimulus signal. Accordingly, if the phase difference between the detection signal and the reference signal is obtained, it is possible to obtain the phase difference between the stimulus signal and the detection signal, and it is easy to derive the phase difference.

The embodiment of the present invention has been described, but the present invention is not limited to the above embodiment.

Figure 13:
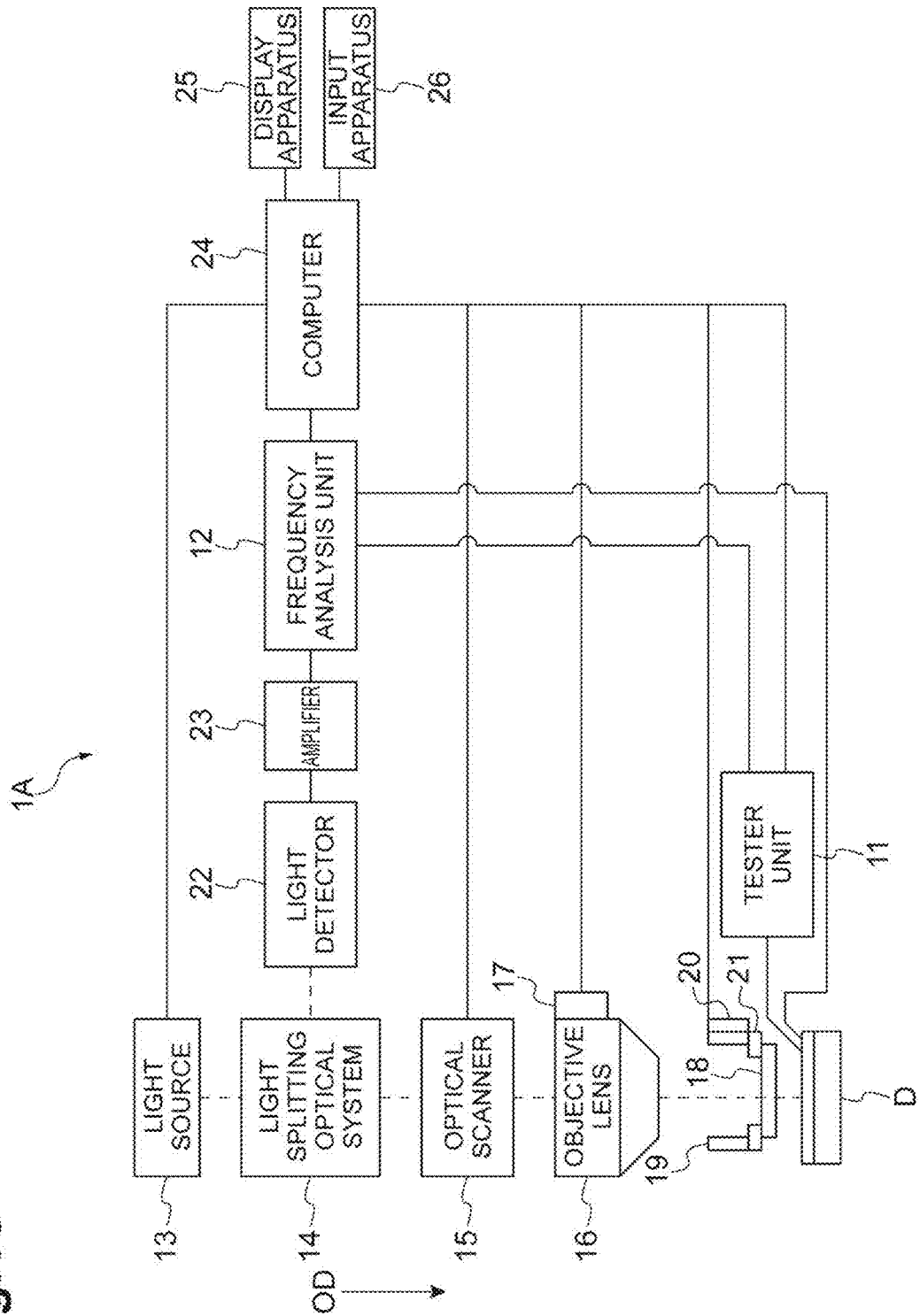
FIG. 13 is a configuration diagram of an inspection apparatus according to a modification example.

For example, the case in which the reference signal is output from the tester unit 11, but the present invention is not limited thereto and the reference signal may be output from the semiconductor apparatus D. In this case, as in the inspection apparatus 1A illustrated in FIG. 13, the semiconductor apparatus D may be directly coupled to the frequency analysis unit 12 via the apparatus control cable. Further, the reference signal may be input to the frequency analysis unit 12 from the semiconductor apparatus D via the tester unit 11. The reference signal according to the stimulus signal is output from the semiconductor apparatus D to which the stimulus signal has been applied, and the reference signal is input to the frequency analysis unit 12.

Further, the case in which the computer 24 calculates the statistical value of the skewness or the like to generate the current path image has been described, but the present invention is not limited thereto, and the computer 24 may generate, as the current path image, a phase image in which a phase component is mapped, a sine image in which a sine component is mapped, a cosine image in which a cosine component is mapped, an I/Q image generated from the sine image and the cosine image, a statistical value image in which a statistical value of the phase component is mapped, or the like.

Further, the computer 24 uses the variance, the skewness, and the kurtosis as the statistical value that is used to generate the current path image, but the present invention is not limited to thereto, and other statistical values for clarifying the difference in the degree of variation between the luminance values of the current path portion and the non-current path portion may be used.

REFERENCE SIGNS LIST

1: inspection apparatus
11: tester unit (signal application unit)
12: frequency analysis unit
13: light source
15: optical scanner (irradiation optical system)
18: MO crystal (magneto-optical crystal)
22: light detector
24: computer (analysis unit, current path image generation unit)

The invention claimed is:

1. An inspection method for acquiring a path of a current generated in a semiconductor device by applying a stimulus signal to the semiconductor device, the inspection method comprising:
applying the stimulus signal to the semiconductor device;
irradiating a magneto-optical crystal disposed facing the semiconductor device with light;
detecting light reflected from the magneto-optical crystal and outputting a detection signal; generating phase image data based on a phase difference between a reference signal generated based on the stimulus signal and the detection signal, the phase image data comprising a phase component indicating the phase difference; and
generating an image indicating the path of the current based on the phase image data, wherein generating the image indicating the path of the current comprises generating statistical value image data by calculating a statistical value of the phase component based on luminance of pixels included in a portion of the phase image data and mapping statistical values of each of the pixels, and generating the image indicating the path of the current based on the statistical value image data.

2. The inspection method according to claim 1,
wherein generating the image indicating the path of the current comprises generating sine image data indicating a sine component and cosine image data indicating a cosine component based on the phase image data, and generating the image indicating the path of the current based on the sine image data and the cosine image data.

3. The inspection method according to claim 2,
wherein generating the image indicating the path of the current comprises performing calculation of any one of addition, multiplication, and a square root of sum of squares on the sine image data and the cosine image data.

4. The inspection method according to claim 2,
wherein generating the image indicating the path of the current comprises:
generating sine statistical value image data indicating a statistical value of the sine component based on the sine image data, generating cosine statistical value image data indicating a statistical value of the cosine component based on the cosine image data, and generating the image indicating the path of the current based on the sine statistical value image data and the cosine statistical value image data.

5. The inspection method according to claim 1,
wherein the statistical value is any one of variance, skewness, and kurtosis.

6. The inspection method according to claim 1,
wherein the reference signal is a signal having the same phase and cycle as the stimulus signal.

7. An inspection apparatus for acquiring a path of a current generated in a semiconductor device by applying a stimulus signal to the semiconductor device, the inspection apparatus comprising:
a tester configured to apply the stimulus signal to the semiconductor device;
a magneto-optical crystal configured to be disposed facing the semiconductor device;
a light source configured to output light; an irradiation optical system configured to irradiate the magneto-optical crystal with the light output from the light source;
a light detector configured to detect light reflected from the magneto-optical crystal, and output a detection signal;
an analyzer configured to generate phase image data based on a phase difference between a reference signal generated based on the stimulus signal and the detection signal, the phase image data comprising a phase component indicating the phase difference; and
a current path image generator configured to generate an image indicating the path of the current based on the phase image data, wherein
the current path image generator generates statistical value image data by calculating a statistical value of the phase component based on luminance of pixels included in a portion of the phase image data and mapping statistical values of each of the pixels, and generates the image indicating the path of the current based on the statistical value image data.

8. The inspection apparatus according to claim 7,
wherein the current path image generator generates sine image data indicating a sine component and cosine image data indicating a cosine component based on the phase image data, and generates the image indicating the path of the current based on the sine image data and the cosine image data.

9. The inspection apparatus according to claim 7,
wherein the current path image generator performs calculation of any one of addition, multiplication, and a square root of sum of squares on the sine image data and the cosine image data.

10. The inspection apparatus according to claim 8,
wherein the current path image generator generates sine statistical value image data indicating a statistical value of the sine component based on the sine image data, generates cosine statistical value image data indicating a statistical value of the cosine component based on the cosine image data, and generates the image indicating the path of the current based on the sine statistical value image data and the cosine statistical value image data.

11. The inspection apparatus according to claim 7,
wherein the statistical value is any one of variance, skewness, and kurtosis.

12. The inspection apparatus according to claim 7,
wherein the reference signal is output from the tester.

13. The inspection apparatus according to claim 7,
wherein the reference signal is output from the semiconductor device.

14. The inspection apparatus according to claim 7,
wherein the reference signal is a signal having the same phase and cycle as the stimulus signal.

* * * * *